(12) United States Patent
Mitra et al.

(10) Patent No.: US 7,325,209 B2
(45) Date of Patent: Jan. 29, 2008

(54) USING PATTERNS FOR HIGH-LEVEL MODELING AND SPECIFICATION OF PROPERTIES FOR HARDWARE SYSTEMS

(75) Inventors: Raj Shekher Mitra, Bangalore (IN); Praveen Tiwari, Bangalore (IN); Manish Kumar Saluja, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 175 days.

(21) Appl. No.: 11/282,071

(22) Filed: Nov. 17, 2005

(65) Prior Publication Data
US 2006/0156145 A1 Jul. 13, 2006

Related U.S. Application Data

(60) Provisional application No. 60/629,008, filed on Nov. 17, 2004.

(51) Int. Cl.
*G06F 17/50* (2006.01)
(52) U.S. Cl. .................... 716/5; 716/1; 716/4; 716/18
(58) Field of Classification Search ................ 716/1, 716/2, 4, 5, 18
See application file for complete search history.

(56) References Cited

U.S. PATENT DOCUMENTS

2006/0117274 A1* 6/2006 Tseng et al. ................. 716/1

* cited by examiner

*Primary Examiner*—Thuan Do
(74) *Attorney, Agent, or Firm*—Robert D. Marshall, Jr.; W. James Brady; Frederick J. Telecky, Jr.

(57) ABSTRACT

This invention is a high-level language to specify electronic system design patterns for functional verification. This invention includes automatic translation of the high-level language specification into assertion code from these patterns and temporal properties for design verification. This eliminates the need to code extra RTL to handle features such as pipelines and bus priorities. Such common features are specified only in high-level patterns and temporal properties to be verified. This is advantageous because less verification code to be written, automated synthesis of assertions enforces monitor-style of writing assertions rather than generator-style, and the high-level code can be seamlessly migrated to another verification tool by producing another code generator for the new assertion language.

7 Claims, 3 Drawing Sheets

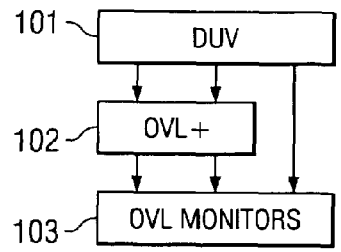
FIG. 1
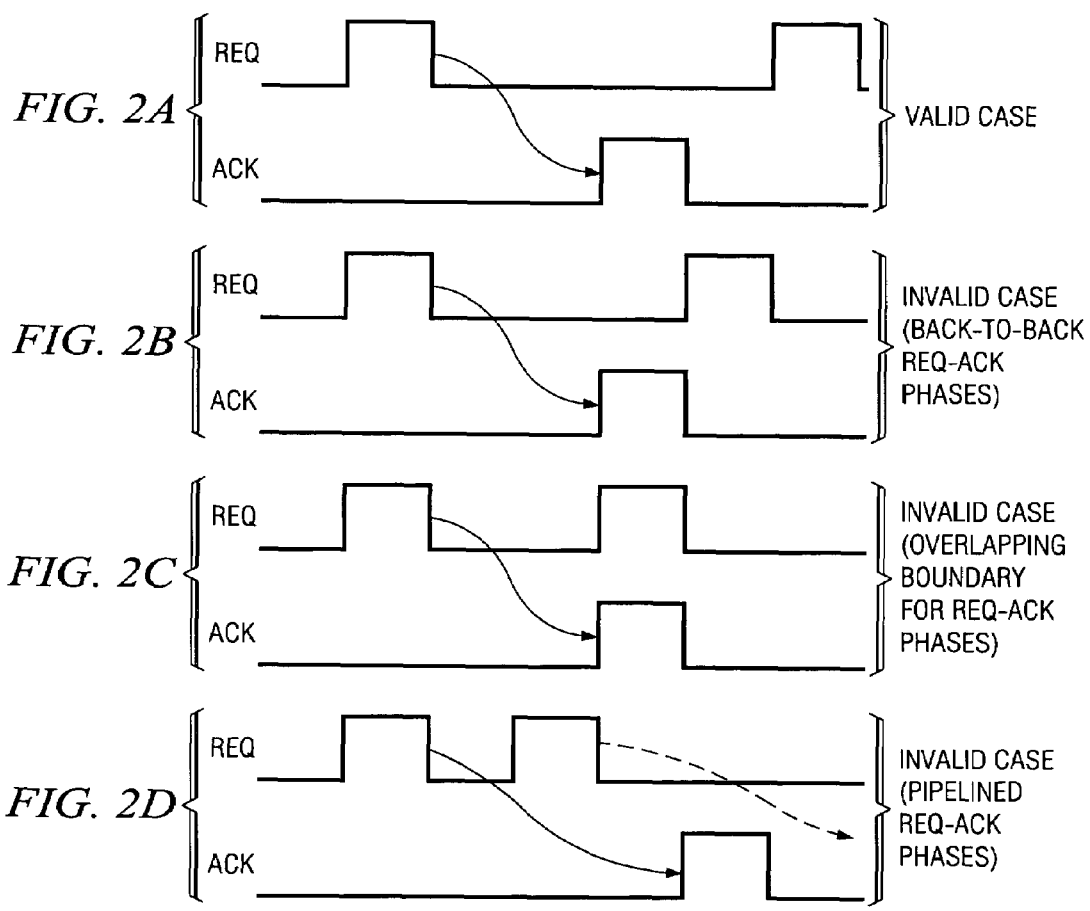
FIG. 2A — VALID CASE
FIG. 2B — INVALID CASE (BACK-TO-BACK REQ-ACK PHASES)
FIG. 2C — INVALID CASE (OVERLAPPING BOUNDARY FOR REQ-ACK PHASES)
FIG. 2D — INVALID CASE (PIPELINED REQ-ACK PHASES)

USING PATTERNS FOR HIGH-LEVEL MODELING AND SPECIFICATION OF PROPERTIES FOR HARDWARE SYSTEMS

CLAIM OF PRIORITY

This application claims priority under 35 U.S.C. 119(e)(1) from U.S. Provisional Application 60/629,008 filed Nov. 17, 2004.

TECHNICAL FIELD OF THE INVENTION

The technical field of this invention is modeling and specification of hardware systems for design verification in computer aided design.

BACKGROUND OF THE INVENTION

Writing properties for hardware functionality verification in computer aided design is a difficult task. This is one of the main obstacles in applying formal verification techniques. Writing properties is difficult because hardware designers tend to write them in terms of implementations, whereas they should be specified at a higher functional level. This difficulty in functional verification reduces the advantages of computer aid design.

SUMMARY OF THE INVENTION

This invention simplifies the writing of properties to become reusable and flexible hardware modeling patterns. By using modeling patterns, the designer does not have to write any implementation code. This restricts the properties to being functional. A library of reusable patterns further simplifies the task to selecting patterns from the library. The patterns are made flexible through parameters. A wide range of modeling styles can be covered by a small set of generic patterns by selecting different values of parameters. Using these patterns provides properties that are written in a very compact and simple way.

This invention includes a computer translator which automatically converts the high level properties into the low-level code. The user would otherwise have to write this low-level code directly. A comparison between the sizes of the high-level properties and the generated code gives a measure of the compactness and utility of this invention.

This invention is different than other solutions to this problem because the invention is a completely new way of writing specifications (i.e. properties) of a hardware design.

This invention is advantageous because it results in very compact code for writing high-level properties and the user does not have to write implementation details.

This invention also allows verification flow independent of the verification tool. The translator of the preferred embodiment converts the high level properties into Accellera's Open Verification Library (OVL) code which is used by the Blacktie verification tool. Only the code generation part of the translator is changed to support another tool. The modified translator automatically converts the high-level properties to the assertion code of the new tool.

BRIEF DESCRIPTION OF THE DRAWINGS

These and other aspects of this invention are illustrated in the drawings, in which:

FIG. 1 illustrates a generic and reusable library of RTL modules and assertions that can be used with any verification environment;

FIG. 2 illustrates some of the valid and invalid scenarios for this assertion;

DETAILED DESCRIPTION OF PREFERRED EMBODIMENTS

Figure 3:
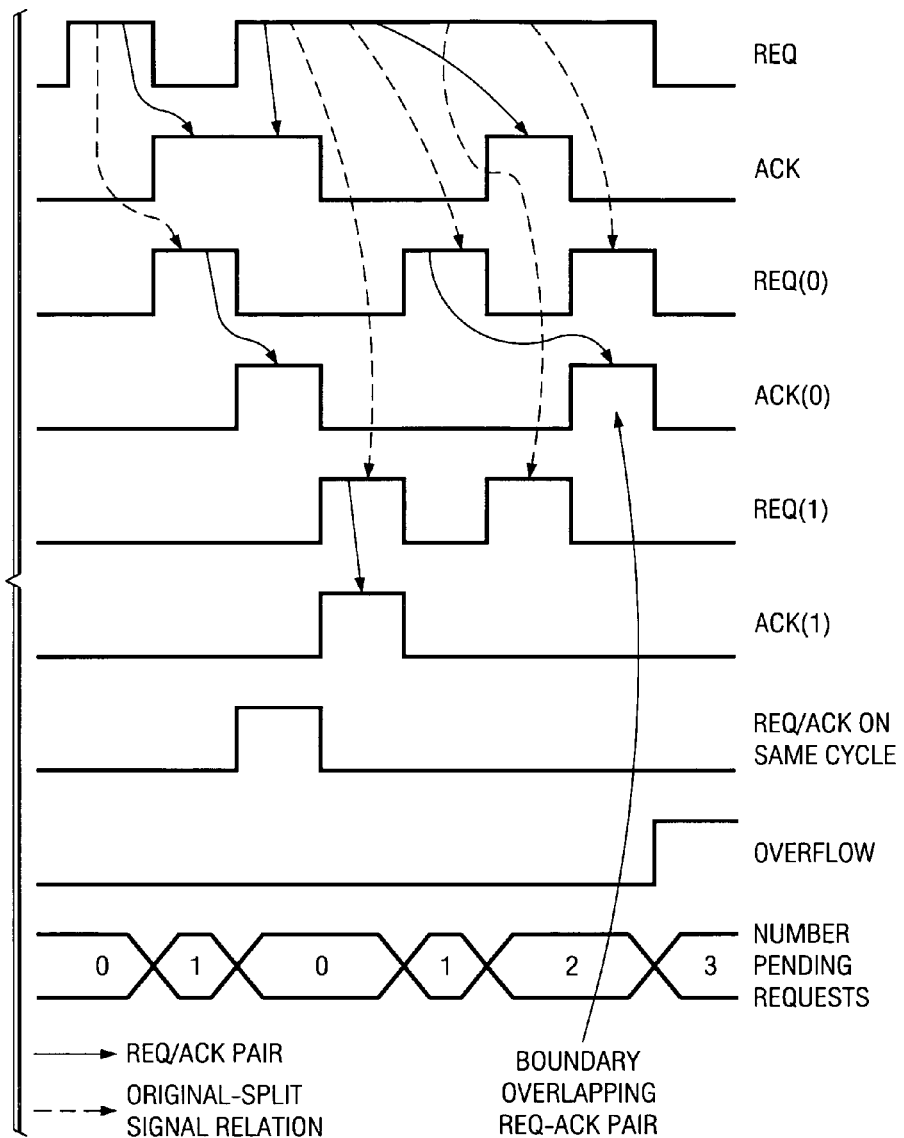
FIG. 3 illustrates an example output of the pipeline splitter for a two-stage pipeline.

With the increase in complexity and size of hardware designs using computer aided design, functional verification has become more important and more difficult task in integrated circuit design. In particular, as designs become more complex through the introduction of aggressive pipelining and concurrently operating subsystems, it has become increasingly difficult to anticipate the many subtle interactions between seemingly unrelated system activities. In addition, the interaction and dependencies of various blocks in a design are described informally in specification documents. This makes it difficult to determine the correct behavior of the system. Assertions and formal verification provide a way to document the complex behavior accurately and to verify the design completely.

This last statement is easier said than done. There is a significant reluctance from designers in adopting these practices in spite of the demonstrated benefits of specifying and verifying properties. This reluctance is because designers are unfamiliar with the specification processes, notations and strategies.

In recent years computer aided design is universal in design of integrated circuits. The designer(s) move from a functional specification of the functions of the proposed integrated circuit to computer design. The designer(s) specify the internal parts using various design languages. Such designs often include the computer files of previous designs used as modular parts in the new design. Once the design is complete, computer automated tools convert the computer file specifying the design into a set of production masks needed to manufacture the integrated circuit. Functional verification determines whether the actual computer design provides the originally intended functionality. Functional verification is a non-trivial task made worse by the incorporation of modules designed by others. The current designer(s) often have no detailed knowledge of the operation of reused modules. Functional verification usually employs a computer program to query the computer file of the design to test whether it fulfills the design goals.

Several factors need to be considered in selecting an appropriate specification language for functional verification. These factors include adequate tool support, ease of use and scope of usage, expressive power and level of abstraction. Several property specification languages exist today including Open Verification Library (OVL), System Verilog Assertions (SVA), Problem Statement Language (PSL), CTL and LTL. OVL seems to have a wider user acceptability than others because "it works right out of the box for today's designs" and it is supported by the leading commercial formal verification tools.

OVL is a library of commonly used assertions. The user may have to choose the relevant options or write additional Register Transfer Language (RTL) code to suit specific needs. The use of common assertions, assertion patterns, is a definite advantage of using OVL. A disadvantage is that the user has to know the appropriate options to use these library elements optimally and may have to write extra RTL to suit specific needs. This problem is aggravated for a new user because the assumptions of OVL are not always consistent across all the assertions of the library. For example: assert_handshake considers a 0 to 1 transition of the 'req' as a start event, whereas assert_next considers a level 1 of 'start_event' as a start event; assert_win_unchange starts monitoring the 'test_expr' one cycle after the 'start_event,' whereas assert_handshake monitors the 'ack' signal from the same cycle as 'req.' This requires detailed knowledge of all the OVL assertions for efficient use. This sometimes degenerates into extreme situations in the hands of a designer inexperienced in using OVL optimally. The designer may simply choose to always use the "assert_always" assertion and build all the extra logic in RTL without using more relevant assertions in the library.

The root cause of these problems with OVL is two-fold. OVL includes assertion patterns and not specification patterns. These assertions are at the code level rather than at the functional or architectural level. The use model is too simplistic. Only assertion instantiation is allowed with their parameters, which requires a detailed understanding of their effects. Any exception is handled through extra RTL code.

This invention solves this problem by: raising the level of abstraction of the patterns from the code to the architecture level; and providing an automation path to generate the relevant assertion code. Using high-level patterns significantly reduces the amount of code that the users have to write and eases the task of property specification. The synthesis capability generates the code and allows the functional specification to be OVL independent. This invention may move to another verification tool and its assertion language while keeping designs and properties intact, by merely changing the code generation.

This application describes this invention with OVL examples, however the problems and solutions are equally applicable to other assertion languages. These assertion languages are the entry level languages for the verification tools. The higher level of specification is independent of OVL, and only the translation algorithm needs to change to support a different assertion language.

This application describes the QuickSpec property specification language. Properties can be written at a higher level than assertions. The compiler of this invention generates OVL assertions from the QuickSpec properties. This compiler also uses a library of RTL modules and assertions, called OVL+ package. The code generated from QuickSpec will contain instantiations of OVL and OVL+ modules, assertions and some glue logic.

This application begins with a short description of the OVL+ package, and illustrates the usage of some of its modules and assertions. This is followed by a description of the features of QuickSpec language. Then this application describes the translation step, showing mappings between features of QuickSpec and the assertions/modules of OVL/OVL+, and some results demonstrating the compact code that can be written in QuickSpec. This application concludes with a discussion on the advantages of this way of writing properties and compares this invention to other relevant approaches.

Accellera's Open Verification Library (OVL) is an open source and vendor independent library of assertion monitor modules, written in standard high level design languages (HDLs) like Verilog/VHDL, that can be used directly or combined using temporal logic for more complicated monitors. They can be used in various verification environments ranging from simulation to formal verification. This dual use provides greater confidence of overall verification coverage than other pure formal approaches. Assertion monitors can be placed on. interfaces, corner case implementations and at specific points in the design for which functional validation is required.

OVL provides the base set of assertions, but often they cannot be used directly to handle complex features. For example, pipelining requires the derivation of extra signals from the design under verification (DUV). This extra RTL constitutes the core component of OVL+. FIG. 1 illustrates a generic and reusable library of RTL modules and assertions that can be used with any verification environment. The device under verification (DUV) 101 supplies signals to the OVL+ module 102 and the OVL monitors 103. OVL+ module 102 also supplies signals to OVL monitors 103. OVL+ module 102 and OVL monitors 103 operate upon signals from DUV 101 to verify the proper design of DUV 101 following the corresponding design criteria. This application describes two elements of OVL+ with relevant illustrations showing where they are applied.

One of the features to be monitored during protocol verification is the correct relationship between the request and acknowledge signals. OVL provides an assertion which can be applied for this purpose but it cannot be directly applied for OCP verification. The assertion is:

assert_handshake #(min_ack_cycle, max_ack_cycle, req_drop, deassert_count, max_ack_len) inst_name (req, ack)

This application does not mention the arguments 'clock' and 'reset' of the OVL assertions nor some of the standard parameters like severity and options indicating constraint or assertion for the sake of brevity. Only the relevant parameters and arguments are shown explicitly in the code, the others are assumed to be implicitly present.

This assertion assumes a non-pipelined sequence of transactions and also requires req and ack to be deasserted before a new req-ack phase can begin. FIG. 2 illustrates some of the valid and invalid scenarios for this assertion. FIG. 2A illustrates a valid case with the ack signal following the req signal. FIG. 2B illustrates an invalid case. This is invalid because the ack and the next req are back-to-back in phase. FIG. 2C illustrates a second invalid case, where the following req signal overlaps the ack to the first req signal. FIG. 2D illustrates another invalid case. In FIG. 2D the device under verification is pipelined. The second req signal appears before the ack to the first req signal. All these scenarios are valid scenarios for OCP. In the context of request-response phase ordering and pipelining, the signals in FIG. 2 are not actual signals from OCP, but represent the start/end of pipelined phases of OCP. The code sample shown in Listing 1 shows how these signals are abstracted from the actual OCP signals.

For a non-pipelined req-ack scenario, the req signal can be asserted only on the next cycle of the previous ack signal. There has to be at least one cycle latency between consecutive req-ack phases when both req and ack need to be deactivated. In a real protocol there is no such constraint. A boundary overlapping scenario is a special-case arising out of pipelining, where there is an overlap of consecutive req-ack phases. In this case, the req signal can assert on the same cycle as the ack signal of the previous pending req. The 'pipeline-splitter' and 'assert_pulse_handshake' modules were developed as described below to support pipeline and boundary-overlapping.

The pipeline splitter acts as an interface between the pipelined req-ack signals and the non-pipelined OVL assertions. It splits or flattens the pipeline activity before being used as inputs to the assertions. For a single pipelined req-ack signal pair, the splitter produces two signal vectors req[0. . . N−1] and ack[0. . . N−1], where the ith elements of the vectors index to the ith req-ack pair in the pipelined series. N is the maximum depth of the pipeline the system supports and the same as the pipeline depth of the DUV. The output of the pipeline-splitter thus represents the req-ack activity as if the pipeline did not exist.

The pipeline-splitter implemented in VHDL uses a simple queue to store information about req-ack pairs and generates output 'pulses' for start and end of each req-ack activity on its outputs. The splitter also provides utility signals depicting scenarios like:

req and corresponding ack signals occur on the same cycle;

ack signal occurs and there is no pending req (underflow); and req signal occurs when the pipeline is full (overflow).

These signals used with the pulse outputs can be used to monitor the properties of any pipelined system. FIG. 3 illustrates an example output of the pipeline splitter for a two-stage pipeline. The upper curves req and ack are the native signals. The curves req(0), ack(0), req(1) and ack(1) show the results of the pipeline splitter. Note that the splitter introduces a one-cycle delay between an input signal and its corresponding pulse/split signal on the output. FIG. 3 also illustrates a boundary overlapping scenario, where ack for a previous req overlaps with a new req.

Pipelines can thus be separated into serialized pulses by the pipeline-splitter. This does not take care of the boundary overlap problem mentioned above in the context of OCP. An assert_pulse_handshake assertion, which works in tandem with the pipeline splitter, handles this problem.

The output pulses from the pipeline splitter feed the assert_pulse_handshake. This assertion is similar to the assert_handshake of OVL, except that it assumes the req and ack signals are pulses and does not perform checks on the length of the req and ack signals. Hence a req/ack signal spanning more than one clock cycle is treated as multiple requests/acknowledgements.

The state machine for assert_pulse_handshake consists of two states. These two states monitor whether a req is pending. If this is the case, a simultaneous req and ack are treated as overlapping transactions. OVL assertions directly call the VHDL assert statement. In this invention upon creating OVL+ assertions the state machines are coded so that 'error checking' is not part of the finite state machine (FSM). Instead, combinational logic based on current state of the machine and the inputs is used to assign status or window signals. These in turn are used as inputs to base level OVL assertions, like assert_always, assert_never, etc. Several other modules have been written in OVL+ to handle real verification scenarios that OVL cannot handle directly.

QuickSpec consists of several segments of code: signal declarations: Boolean combinational logic declarations; pattern declarations; and property specifications. The segments for signal and logic declarations are like in any HDL. Listing 1 shows the partial QuickSpec code for the OCP protocol verification, which illustrate the different code segments. More examples are provided in the next section, which describes the translation rules.

Property declarations generally follow the syntax of System Verilog Assertions (SVA). This will not be described these in much detail here. An example of a property is shown below, which states that a request should be acknowledged after 3 cycles.

```
property prop1;
    @(posedge clk) req ##3 ack;
endproperty
```

There are three types of operators: the sequencing operators which build up sequences; the Boolean operators which combine pieces of Boolean logic; and the event operators which define when the property would be activated, such as posedge. There are some system functions, such as $past (sig, n) which refers to the value of sig in the nth previous cycle, which provide key functionalities.

```
#define clock ocp_clock;    // definition of primary clock
#define reset ocp_reset_n;  // definition of reset signal
                            // Define the inputs
input ocp_MCmd[2:0], ocp_SCmdAccept, ocp_SResp[1:0];
constant OCP_IDLE_CMD [2:0]  = "000";
constant OCP_READ_CMD [2:0]  = "010";
constant OCP_NULL_RESP [1:0] = "00";
constant OCP_ERR_RESP [1:0]  = "10";
  // Define Boolean expressions for property specification
sig_mas_req_start = (
  ($past(ocp_MCmd) == OCP_IDLE_CMD &&
    ocp_MCmd != OCP_IDLE_CMD ) ||
  ($past(ocp_MCmd) != OCP_IDLE_CMD &&
  $past(ocp_SCmdAccept) ) &&
  (ocp_MCmd != OCP_IDLE_CMD));
sig_mas_req_end = (ocp_MCmd != OCP_IDLE_CMD) &&
  (ocp_SCmdAccept);
sig_mas_req_accept_window = ocp_MCmd != OCP_IDLE_CMD
  && !ocp_SCmdAccept;
    // Define the properties for OCP
    // Master command stable until accepted by slave
property prop1;
@(posedge clock)
    sig_mas_req_accept_window |->
    $past(ocp_MCmd) == ocp_MCmd;
endproperty
    // Define pipeline (DUV dependent parameter)
pattern request_response;
    handshake (sig_mas_req_start, sig_slave_resp_start) [2];
endpattern
    // Slave response cannot get started before
    // the start of corresponding request phase
property prop2;
    @(posedge clock) (sig_slave_resp_start == 1'b1)
        |-> $pending(sig_mas_req_start)!=0;
endproperty
```

Listing 1

The syntax of patterns is similar to that of properties:

```
pattern request_response;
    handshake (req, ack) [2];
endpattern
```

A pattern consists of an identifier, a keyword which identifies the type of the pattern and a set of arguments and parameters which characterize the pattern. Each pattern has its unique set of arguments and parameters. In the above example, a handshake is characterized by a pair of signals:

the request; and its acknowledgement. It is parameterized by the depth of pipeline that the system can support. This pipeline depth is 2 in the above example.

Patterns can also be hierarchically combined. This is the only place where a pattern can be referred to explicitly. An example is shown below, where a pattern that sets the priority among signals refers to the handshake pattern defined earlier.

Patterns can have functions associated with them. These are interface functions for the pattern which handle internal signals similar to what a Pop and Push do for a Stack Abstract Data Type. An example is $pending(sig), which refers to the output of the pipeline_splitter module which represents the handshake pattern. It is not necessary for all properties of the system to be written by the user. Some default properties are derived automatically from a pattern, such as for error checking, as shown below.

The first key aspect of patterns is that the properties do not explicitly instantiate them or refer to them. Properties are referred to only through their arguments or their associated functions. The code generated for a property will change depending on the pattern that it refers to and its parameters.

The second key aspect of patterns is that on using them, the only code a user has to write is for the properties alone which includes the definitions of sequences and combinational logic. The user is not allowed to write any RTL or state machines to support the properties. This forces a clean monitor-style as opposed to the generator-style of writing properties.

This is the main motivation for creating our patterns. They reduce the verification code that a user has to write and limit it only to the properties to be verified. From this perspective, a pattern is oriented towards modeling a design for verification.

This application shows the use of QuickSpec patterns with some examples. The repertoire of patterns is expected to expand to handle other application domains. QuickSpec provides a framework for applying patterns to make the coding of properties simpler and concise.

Figure 4:
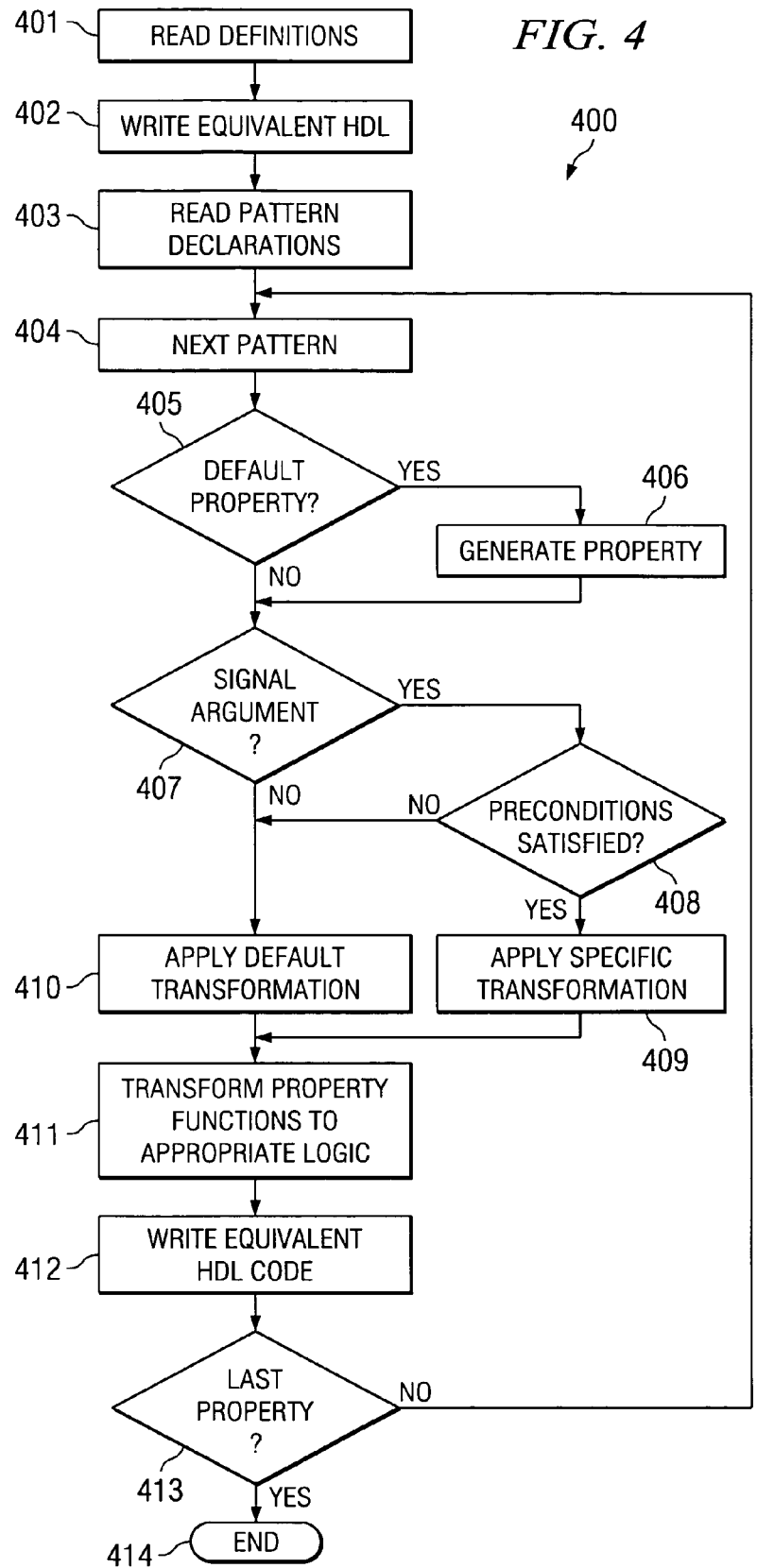
FIG. 4 illustrates the algorithm for the translation of the property specification into its equivalent OVL+ assertion code.

The QuickSpec compiler reads a property specification and translates it into its equivalent OVL+ assertion code. FIG. 4 illustrates the algorithm for this translation. This application will describe some of the transformation rules, first the rules that apply to the patterns, then some of the generic rules that apply to the sequence definitions and auxiliary logic.

FIG. 4 illustrated algorithm 400. Algorithm 400 begins in step 401. Step 401 reads the definitions of clocks, inputs and constants. Step 402 writes the equivalent HDL version of each Boolean assignment. Step 403 reads the pattern declarations. Step 404 advances to the next pattern declared each time through the loop. For the first iteration of the loop this next declared pattern is the first declared pattern. Test 405 determines if the current pattern has some default properties to be generated. If so (Yes at test 405), then step 406 generates the default properties. Thereafter test 407 determines if there are signals that are arguments of the current pattern. If so (Yes at test 407), test 408 determines if any pre-conditions are satisfied. If so (Yes at test 408), then step 409 applies the specific transformation rules to the current pattern. If either test 407 or test 408 is No, then step 410 applies the default transformation rule. Flow then passes to step 411.

Step 411 transforms the property's system functions into the appropriate logic. Step 412 then writes out the equivalent hardware description language (HDL) code including the OVL/OVL+ instantiations and any required RTL code. Test 413 determines if the current property is the last property. If not (No at test 413), the flow passes to step 404. This repeats the loop for the next property. If the current property is the last property (Yes at test 413), then algorithm 400 exits via end step 414.

Each rule is described in a table of two rows. The first row shows the QuickSpec code, and the second row shows the generated code. In each row, additional information is shown as comments "//." The preconditions and application of the rule is described in the associated passage. The definitions of the signals for the properties are not shown explicitly. Only the definitions of the signals newly created for the assertion code are shown. All signals are assumed to be active high. For active low signals, the user must insert appropriate negations.

A handshake pattern defines the basic relationship between a request and acknowledgement signal pair. For every request there is a corresponding acknowledgement, not necessarily following immediately after. These signals are assumed to be levels, so if the req signal is '1' for two consecutive cycles then it implies two requests. At any time, there may be up to the pipeline depth number of requests for which the corresponding acknowledgements have not arrived. Further details of the req-ack relationship, such as how much time before an ack is expected, are defined in terms of the property definitions.

A reference to a handshake pattern is mapped to an instance of pipeline_splitter and the outputs of the splitter are inputs to the assert_pulse_handshake or other OVL assertions.

In the example below, both the signals of the property are arguments to the handshake pattern and hence the rule is applied. If any of the signals is not an argument of the handshake pattern, then the default rule would be applied. Two assertions are generated for this example because the pipeline has a depth 2.

The second property uses a system function, $pending( ), which is associated with the handshake pattern. Its argument is expected to be the request signal defined as the 'req' argument of a handshake pattern. This function gets mapped to the output of the pipeline-splitter module, which refers to the number of pending requests at any instant.

Note that the property in which $pending() is used, need not be the same as the property which causes the pipeline-splitter to be instantiated. In general, instantiation of code is associated with the property that first refers to a pattern. This is because a pattern may have several pieces of code associated with it, and only some of them may be useful for a specific property.

The default property generated for this pattern is the check for overflow: ($err_handshake( )==0); where $err_handshake is a function that returns the error value. This results in the assertion prop1_3.

```
// define handshake signals with pipeline depth of 2.
pattern request_response;
    handshake (req, ack) [2];
endpattern
    // Any request should be acknowledged after 3 cycles:
property prop1;
    @(posedge clk) req ##3 ack;
endproperty
            // No ack is expected, if no pending request:
property prop2;
@(posedge clk) (ack==1'b1) |->
    $pending (req)!=0;
```

```
endproperty
wire [1:0] prop1_vec_req, prop1_vec_ack;
wire [1:0] prop1_num_pending_reqs, prop1_err;
pipeline_splitter #(2) prop1_0 (req, ack,
   prop1_num_pending_reqs, prop1_vec_req, prop1_vec_ack,
   prop1_err);
assert_pulse_handshake #(3,3) prop1_1 (prop1_vec_req[0],
   prop1_vec_ack[0]);
assert_pulse_handshake #(3,3) prop1_2 (prop1_vec_req[1],
   prop1_vec_ack[1]);
assert_always prop1_3 (prop1_err==2'b00);
assert_implication prop2_1 (ack,
   (prop1_num_pending_reqs!=2'b00));
```

Listing 2

A priority pattern defines the ordered priorities between req-ack signal pairs on a single clock cycle. The priority pattern assumes a priority-queue data structure, in which elements are inserted when the requests arrive and deleted when their acknowledgements arrive. Multiple requests and acknowledgements can arrive simultaneously. In the example below, if (a,b,c) arrive on the first clock and (a,c) arrive on the second clock, then they will get prioritized as: a,b,c,a,c.

This pattern has one parameter, which can be set for Fixed or RoundRobin Priority. If the latter is set then the priorities are dynamically changed after a request is processed that signal becomes the lowest among the priorities. The functions associated with this pattern are $is_priority(sig, n) and $err_priority( ). The pattern $is_priority(sig, n) tests whether a given signal is at the nth position in the priority queue. If n is not mentioned then it indicates the top position. The pattern $err_priority( ) informs whether there was an underflow or overflow.

The following example defines a pattern with the FixedPriority set assuming that the acknowledgements arrive one at a time (i.e. one-hot). This results in the following properties to be written by the user. This example also shows how different patterns can be hierarchically combined.

```
            // define handshake signals
pattern a_handshake;
   handshake (a_req, a_ack) [2];
endpattern
            // similarly define b_handshake and c_handshake
...
            // define priority over a set of buses
pattern abc_priority;
   priority (a_handshake, b_handshake,
      c_handshake)   [_ES_FixedPriority];
endpattern
            // if a request for 'a' is pending, then
            // ack for 'b' and 'c' cannot come:
property prop1;
   $is_priority(a_req) |->
   (b_ack==1'b0) && (c_ack==1'b0);
endproperty
      // similar property also for 'b's' priority over 'c.'
...
            // if a_ack has arrived, then the pending signal
            // must be a_req.
property prop3;
   (a_ack==1'b1) |-> $is_priority(a_req);
endproperty
wire [1:0] prop1_queue_out_1, prop1_err;
         // priority_queue has internal queue of size 6:
         // requests for 3 signals, each with pipeline=2.
```

```
         // queue_out indicates which is the highest
         // priority element: a_req is 01, b's is 10,
         // c's is 11.
priority_queue #(6) prop1_0 (a_req, b_req, c_req, a_ack,
   b_ack, c_ack, prop1_queue_out_1, prop1_err);
assert_implication prop1_1 (prop1_queue_out_1==2'b01,
   (b_ack==1'b0)&&(c_ack==1'b0));
...
assert_implication prop1_3 (a_ack==1'b1,
   prop1_queue_out_1==2'b01);
assert_always prop1_4 (prop1_err==2'b00);
```

Listing 3

If the assumption of one-hot acknowledgements does not hold, then the user would have written the properties in the following way. Note the exact syntax is not mentioned in Listing 3. The code generated for this accesses the prop1_queue_out_1 and prop1_queue_out_2 outputs of the priority_queue module, which access the top and second elements of the queue.

```
         // if a_ack is present, a_req must be at the top:
(a_ack==1'b1) |-> $is_priority(a_req);
         // if b_ack is present, then either b_req is at
         // the top, or (immediately after a_req in
         // the queue, if a_ack is also present):
(b_ack==1'b1) |-> ($is_priority(b_req) ||
         ($is_priority(a_req) && a_ack==1'b1
            && $is_priority(b_req, 2))
                  // similarly check for c's priority
                  // under both a and b . . .
```

Listing 4

The above example illustrates the flexible power of QuickSpec. The module is generated with the specific ports needed by the assertions. Without QuickSpec, a user would probably mingle the code for the priority queue with the properties and let the properties access the queue elements directly. With QuickSpec, this interaction is done automatically and modularly.

To provide additional flexibility, if the one-hot and no-one-hot are found to be very commonly used variations of the ack signals, then this can be made as one more parameter of the priority pattern. In that case, the above properties would be automatically generated by QuickSpec.

If this function is called within any property, then code for a flip-flop is generated. This and the subsequent examples do not include the full syntax of the properties, but only write the relevant parts for the specific transformation rule.

```
( . . . ($past(sig)==1'b1) . . . )
reg prev_sig;
always @(posedge clk)   prev_sig <= sig;
               // then check for the value of
               // prev_sig in the assertion . . .
```

Listing 5

Implication operators occur if there is a match for the antecedent expression. If this is the case, then the consequent expression is evaluated on the same clock or the next clock. The translation of these into OVL is based on some preconditions, a few of which are noted below. Note that changing only some parts of the properties produces differences in the generated code.

A Boolean is represented as a bool_x signal. A sequence is represented as S(n). The variable n refers to the sequence of length in clock cycles. Within this sequence, S[i] refers to the ith element, and S[i:j] refers to the elements i:j. The second parameter for assert_cycle_sequence is the necessary condition.

```
bool_a |-> bool_b;
assert_implication (bool_a, bool_b);
bool_a |=> bool_b;
assert_next (bool_a, bool_b);
bool_a |-> S(n)
assert_implication (bool_a, S[1]);
assert_cycle_sequence #(n, 2) ({bool_a && S[1], S[2:n]});
bool_a |=> S(n);
assert_cycle_sequence #(n, 2) ({bool_a, S(n)});
S(n) |-> bool_a;
    // this is considered as {S(n), $past(bool_a)}
    // (transformation for $past is shown in the next rule.)
assert_cycle_sequence #(n+1, 0) ({S[1], S[2], ... S[n],
    prev_bool_a} );
S(n) |=> bool_a;
assert_cycle_sequence #(n, 0) ({S(n), bool_a});
```

Listing 6

The rules for Sa(n)|→Sb(m) follow a different strategy by first using a sequence_matcher to match the presence of Sa(n). Sequence_matcher is an OVL+ module, very similar to assert_cycle_sequence, but instead of reporting a failure on a mismatch it simply sets an output signal if the match is found. This output is then used in this rule in the same way as "bool_a|→S(m)."

A local variable within a property is mapped to a register. In the following example, a delay of 4 is used because the implication operates on the same clock.

```
property e;
    int x;
    (valid_in, (x=pipe_in))  |->
        ##5 (pipe_out==(x+1));
endproperty
reg [7:0] temp_x;
wire [7:0] x1;
always @(posedge clk)
    if(valid_in) temp_x <= pipe_in;
        // assign x1 = temp_x+1, through an adder.  Then:
assert_next #(4) (valid_in, pipe_out==x1);
```

Listing 7

The translation algorithm follows a syntax-directed translation procedure. No optimizations are done across the different properties since each property is an independent monitor. However, the selection of the appropriate OVL/OVL+ assertion for a property requires a careful analysis of the context of the property. One such example is a property which states that a request should hold until its acknowledgement arrives. If the ack is specified to come only after one cycle from the request, then the OVL assert_win_unchange is used. However, if ack can come on the same cycle as the request, then a window signal is formed which represents the time between req and ack, and subsequently assert_implication would be used with the window signal as the antecedent and a check on the request as the consequent similar to the prop1 property of Listing 1.

The QuickSpec language can be used to specify designs from several domains, such as bus protocols, cache coherence, memory arbitration, BIST logic, etc. The protocol verification implemented in OCP supports pipelines. It also specifies a complex memory arbitration system of pipelining and bus priorities for memory accesses. QuickSpec can specify both the properties as well as the constraints of the device under verification (DUV). The underlying verification tool uses OVL version 03.06.06 as its assertion language. Table 1 lists some of the OVL+ modules that have been written in VHDL for this system.

TABLE 1

| Some OVL+ modules | LOC |
| --- | --- |
| pipeline_splitter | 150 |
| assert_pulse_handshake | 175 |
| sequence_matcher | 90 |
| priority queue (with & without RoundRobin) | 145 |
| auxially functions | 70 |

Table 2 lists the estimated code size reduction for the OCP protocol when QuickSpec was used.

TABLE 2

| Code Segments for OCP (excluding OVL) | LOC |
| --- | --- |
| OVL instantiations | 160 |
| OVL+ modules | 417 |
| Boolean logic, signal declarations, auxiliary RTL, always blocks, language specific lines | 923 |
| OVL/OVL+ Total | 1500 |
| Signal declarations and Boolean logic declarations | 312 |
| Property definitions | 190 |
| QuickSpec Total | 502 |

Table 3 lists the same for property specification of memory arbitration logic. This estimation was made by writing the QuickSpec specifications, manually generating the equivalent OVL/OVL+ code and then comparing the two. The code sizes in these tables do not include the size of the instantiated OVL assertions, which are present whether QuickSpec is used or not.

TABLE 3

| Code for Memory Arbitration (excluding OVL) | LOC |
| --- | --- |
| OVL Instantiations | 1853 |
| OVL+ modules | 700 |
| Boolean logic signal declarations, auxiliary RTL, always blocks, language specific lines | 643 |
| OLV/OLV+ Total | 3196 |
| Signal declarations, Boolean logic declarations | 388 |
| Property definitions | 900 |
| QuickSpec Total | 1288 |

Although the written code is reduced by a factor of 2.5 to 3 times, the estimated productivity gain is much more. A lot of effort had gone into figuring out what OVL+ modules were needed to be developed, making the OVL+ modules bug free, and identifying the appropriate OVL assertions to be called in specific situations.

The importance of using high-level patterns in specification cannot be over stated. These patterns allow the user to think in terms of common domain-specific elements and facilitate the creation of complex specifications. Patterns have been used in design, software verification and hardware verification. However, these patterns have been used more for the purpose of documentation than for simplifying the assertion coding process. The patterns of this invention used in QuickSpec are amenable to automation and are thus more practical. This represents a significant innovation over the prior usages of patterns for specification.

Figure 5:
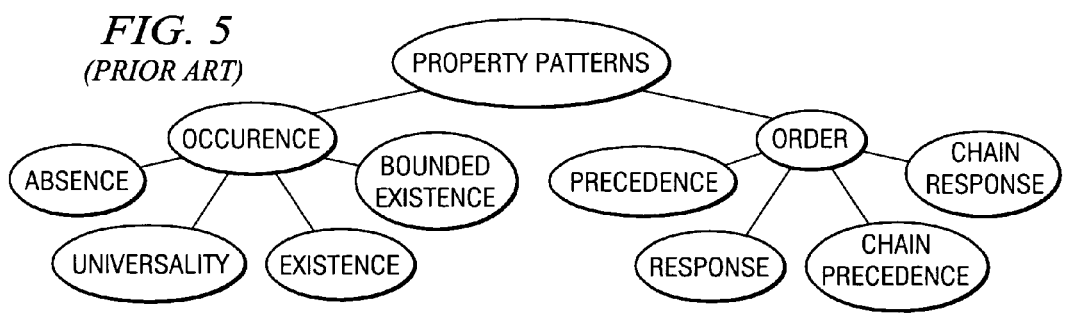
FIG. 5 illustrates some of the prior art patterns and their purpose of documentation and classification.

FIG. 5 illustrates some of the prior art patterns and their purpose of documentation and classification. These purposes do not include automation. The property patterns include occurrences and orders. The occurrences include absence, universality, existence and bounded existence. The orders include precedence, response, chain precedence and chain response.

The main problem with using patterns for automation is to determine the right balance of granularity and generality. This application operates at a sufficiently high level of abstraction so that the specification process becomes simpler, and yet is sufficiently general so that they are not all problem-specific and their number does not explode. Hence, the specification is not wholly dependent on the patterns, but will be a mix of patterns and a behavior modeling language. This invention identifies key functional components, such as pipelining and priority handling, and takes very simple sequence modeling features (from SVA) to connect the various patterns. This invention trims the features of SVA to limit the degrees of freedom available to the designer, so that only the minimum necessary features will be used to write the properties.

The code generation described of this invention is based on the library of OVL assertions and the OVL+ package. The OVL library fits specific patterns. Much work has to be done to fit exactly to real problems, which resulted in the creation of the OVL+ package. New assertion languages are evolving, such as SVA, and it will take some time for efficient and stable commercial formal verification tools to support them. However, it does not matter whether we use OVL or some other lower assertion language because the final assertion code is generated automatically. Thus this invention is independent of the formal verification tools and their entry level assertion languages.

This is a significant benefit of this invention besides the high level of abstraction. Every property language and every formal language builds up a user community having practical experience in using that language. It is very difficult to move this community and its legacy designs to another language even if the underlying verification tool of the new language is more powerful. Hence it is a great advantage to keep the user community that this invention is independent of the specific language of the verification tool.

From the perspective of the high level patterns of Quick-Spec, there is no fundamental difference between GSTE assertion graphs and any other existing low-level property definition language. In assertion graphs, as with SVA and other languages which are entry points to verification tools, extra RTL has to be written for modeling pipelining and other high-level features. There is also no fundamental difficulty in translating QuickSpec specifications into GSTE assertion graphs and subsequently into monitor circuits. Such assertion graphs consists of arcs, each of which corresponds to an assert_implication of OVL or the implication operator of SVA. Token-based synthesis algorithms can be used to handle the branches of the graph. Translation to other assertion languages can be done in a similar manner by synthesizing the sequence definitions into the sequences of the target language using RTL modules similar to those of OVL+ to provide the necessary derived signals to act on.

In this invention, the pipeline-depth is only a parameter of a handshaking or bus priority pattern. This is decoupled from the property specification itself. This separation allows a very flexible style of writing high-level properties. In this invention it is possible to specify that the response should follow within 3 to 10 cycles of the request and that it is pipelined to a depth of 2, in very separate statements. Changing the pipeline depth from 2 to 0 yields a very different coding of the final assertions.

The synthesis algorithm of this invention follows the specification strategy of separating the concepts of patterns and properties. This first derives the necessary internal signals to be monitored, then uses assertions for monitoring them. This invention synthesizes to an entry-language for a verification tool. The subsequent synthesis of the entry language to the efficient monitors is left to the verification tool.

This invention provides a framework to define flexible patterns and use them to simplify the task of writing monitor-style properties. The parameters of the patterns provide flexibility. This can be scalability of the pattern, such as in the depth of the pipeline size of the Handshake pattern. This can change the structure of the underlying objects that implement the pattern as in the selection of the static or dynamic priorities of the priority pattern.

The main contributions of the QuickSpec system are two-fold: (1) it raises the level of abstraction for writing verification properties, and (2) it has an automation path to translate the high level properties into actual assertion code.

This invention is a way to specify verification properties with the help of high-level patterns. This is a key innovation, simplifying the writing of monitor-style properties to a great extent and enforcing the discipline of writing monitor-style specifications. The language does not allow the user to write any state machines other than sequences. This forces the user to think only in terms of the properties and not bother about extending the hardware models to support the properties themselves.

This invention enables code to be written in QuickSpec that is significantly smaller and more readable, than the corresponding assertion code. This invention insulates the user from needing an expert knowledge of the different options of OVL in order to use a verification tool having OVL as its assertion language. This gives a new user a much faster learning curve. Similar benefits are also expected if we use a different target assertion language.

This invention is an automation path to translate the high level properties of QuickSpec into actual assertion code. This invention includes a translation algorithm which maps between the features of QuickSpec and those of OVL. The automated translation of this invention has two more benefits. It forces the reuse of available OVL+ modules, instead of allowing the users to create their own RTL. This is useful, because any extra RTL adds an extra burden on the formal verification tool. It is advisable to keep the size to a bare minimum. Secondly, the automated translation makes the assertions independent of the verification tool. This invention can move to another verification tool without having to change the assertion code. This is a significant benefit in the current evolving standards and tools in formal verification.

What is claimed is:

1. A method of design verification of an electronic circuit design comprising the steps of:
   specifying required design features of the electronic circuit design in a set of patterns in a high-level functional language including at least one pattern selected from a library of patterns;
   automatically converting the specified set of patterns via computer into a corresponding set of assertions in a pre-existing verification language; and
   applying the set of assertions to a computer aided design specification of a design under verification to determine if the design under verification meets the required design features.

2. The method of design verification of claim 1, wherein:
   said step of automatically converting includes
   determining if a pattern includes a default property, and
   generating the default property if a pattern included a default property.

3. The method of design verification of claim 1, wherein:
   said step of automatically converting includes
   transforming system functions of each property into corresponding logic in the pre-existing verification language.

4. The method of design verification of claim 1, wherein:
   said step of automatically converting includes
   generating corresponding register transfer language (RTL) code connecting to the design under verification to condition signals from the design under verification for verification.

5. The method of design verification of claim 1, wherein:
   said step of specifying required design features includes
   selecting a patterns and specifying a property selected from the set including sequencing operations, Boolean operations and event operations.

6. A method of design verification of an electronic circuit design comprising the steps of:
   specifying required design features of the electronic circuit design in a set of patterns in a high-level functional language including at least one pattern selected from a library of patterns;
   automatically converting the specified set of patterns via computer into a corresponding set of assertions in a pre-existing verification language, said step of automatically converting includes
   determining if any signal is an argument of a pattern,
   if a signal is an argument of a pattern determining if any pre-conditions of the pattern are satisfied,
   if a signal is an argument of a pattern and any pre-conditions are satisfied, then applying a transformation rule to that pattern, and
   if a signal is not an argument of a pattern or if a signal is an argument of a pattern and any pre-conditions are not satisfied, then applying a default transformation rule to that pattern; and
   applying the set of assertions to a computer aided design specification of a design under verification to determine if the design under verification meets the required design features.

7. A method of design verification of an electronic circuit design comprising the steps of:
   specifying required design features of the electronic circuit design in a set of patterns in a high-level functional language including at least one pattern selected from a library of patterns;
   automatically converting the specified set of patterns via computer into a corresponding set of assertions in a pre-existing verification language, said step of automatically converting includes transforming system functions of each property into corresponding logic in the pre-existing verification language including pipeline splitting to align signals of the design under verification occurring at different pipeline stages; and
   applying the set of assertions to a computer aided design specification of a design under verification to determine if the design under verification meets the required design features.

* * * * *